(12) United States Patent
Xie

(10) Patent No.: US 9,634,087 B1
(45) Date of Patent: Apr. 25, 2017

(54) FINFET AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Xinyun Xie, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/239,186

(22) Filed: Aug. 17, 2016

(30) Foreign Application Priority Data

Dec. 30, 2015 (CN) .......................... 2015 1 1025328

(51) Int. Cl.
*H01L 21/8238* (2006.01)
*H01L 29/06* (2006.01)
*H01L 21/225* (2006.01)
*H01L 21/265* (2006.01)
*H01L 29/66* (2006.01)

(52) U.S. Cl.
CPC ...... *H01L 29/0638* (2013.01); *H01L 21/2253* (2013.01); *H01L 21/26513* (2013.01); *H01L 21/26586* (2013.01); *H01L 21/823821* (2013.01); *H01L 21/823878* (2013.01); *H01L 29/66795* (2013.01)

(58) Field of Classification Search
CPC ............ H01L 29/0638; H01L 21/2253; H01L 21/26513; H01L 21/26586; H01L 21/823821; H01L 21/823878
See application file for complete search history.

(56) References Cited

U.S. PATENT DOCUMENTS

| 9,368,569 | B1 * | 6/2016 | Leobandung | ..... H01L 29/66795 |
| 2013/0252349 | A1 * | 9/2013 | Pradhan | ............ H01L 21/26513 438/4 |
| 2016/0181161 | A1 * | 6/2016 | Song | ................. H01L 29/66803 257/345 |

* cited by examiner

*Primary Examiner* — Bradley K Smith
(74) *Attorney, Agent, or Firm* — Anova Law Group, PLLC

(57) ABSTRACT

A method is provided for fabricating a FinFET. The method includes providing a semiconductor substrate; forming a hard mask layer on the semiconductor substrate, wherein a position of the hard mask layer may corresponds to a position of subsequently formed fin; forming a doping region in the semiconductor substrate by using the hard mask layer as a mask to perform an anti-punch-through ion implantation process; forming an anti-punch-through region by performing an annealing process onto the doping region, such that impurity ions in the doping region diffuse into the semiconductor substrate under the hard mask layer; and forming a trench by using the hard mask layer as a mask to etch the semiconductor substrate and the doping region, wherein the semiconductor substrates between the adjacent trenches constitutes a fin.

16 Claims, 8 Drawing Sheets

FINFET AND FABRICATION METHOD THEREOF

CROSS-REFERENCES TO RELATED APPLICATIONS

This application claims the priority of Chinese patent application No. 201511025328.X, filed on Dec. 30, 2015, the entirety of which is incorporated herein by reference.

FIELD OF THE INVENTION

The present invention generally relates to the field of semiconductor manufacturing technology and, more particularly, relates to a FinFET and fabrication techniques thereof.

BACKGROUND

With the continuous development of semiconductor process technology, process node is gradually reduced and gate-last process has been widely used, to achieve the desired threshold voltage and to improve the performance of device. However, when the critical dimensions of the device further decline, even with the gate-last process, the structure of conventional metal-oxide-semiconductor (MOS) field-effect transistor (FET) has been unable to meet the demand for the device performance, therefore a FinFET as an alternative to a conventional device has been widely concerned.

Referring to FIG. 1, a FinFET fabricated with existing techniques includes: a semiconductor substrate 200 having a protruding fin 201 formed on the semiconductor substrate 200; an isolation layer 205 covering the surface of the semiconductor substrate 200 and part of side walls of the fin 201; a gate structure 203 crossing the fin and covering part of top and side surfaces of the fin 201, and the gate structure 203 includes a gate dielectric layer and a gate electrode on the gate dielectric layer; sidewall spacers 204 formed on both side walls of the gate structure 203; a source region and a drain region formed in the fin 201 at both sides of the gate structure 203 and the sidewall spacers 204.

For such FinFET, the contacting region between the top and both side walls of the fin 201 and the gate structure 203 is a channel region, which is desired to increase the drive current and to improve the performance of the device.

However, in such FinFET fabricated with existing techniques, a source-drain punch-through phenomenon easily appears between the source region and the drain region and affects the performance of the FinFET. The disclosed device structures and methods are directed to solve one or more problems set forth above and other problems.

BRIEF SUMMARY OF THE DISCLOSURE

One aspect of the present disclosure includes a method for fabricating a FinFET. The method includes providing a semiconductor substrate and forming a hard mask layer on the semiconductor substrate, wherein a position of the hard mask layer may corresponds to a position of subsequently formed fin. The method also includes forming a doping region in the semiconductor substrate by using the hard mask layer as a mask to perform an anti-punch-through ion implantation process. Further, the method includes forming an anti-punch-through region by performing an annealing process onto the doping region, such that impurity ions in the doping region diffuse into the semiconductor substrate under the hard mask layer. Furthermore, the method includes forming a trench by using the hard mask layer as a mask to etch the semiconductor substrate and the doping region, wherein the semiconductor substrates between the adjacent trenches constitutes a fin.

Another aspect of the present disclosure includes another method for fabricating a FinFET. The method includes providing a semiconductor substrate having a first region and a second region and forming a hard mask layer on the semiconductor substrate in the first region and the second region, wherein a position of the hard mask layer on the semiconductor substrate in the first region corresponds to a position of subsequently formed first fin, and a position of the hard mask layer on the semiconductor substrate in the second region corresponds to a position of subsequently formed second fin. The method also includes forming a first doping region in the semiconductor substrate in the first region by using the hard mask layer on the semiconductor substrate in the first region as a mask to perform a first anti-punch-through ion implantation process. In addition, the method includes forming a second doping region in the semiconductor substrate in the second region by using the hard mask layer on the semiconductor substrate in the second region as a mask to perform a second anti-punch-through ion implantation process, wherein a type of impurity ions implanted by the second anti-punch-through ion implantation process is different from a type of impurity ions implanted by the first anti-punch-through ion implantation process. Moreover, the method includes performing an annealing process onto the first doping region and the second doping region, wherein impurity ions in the first doping region diffuse into the semiconductor substrate in the first region under the hard mask layer to form a first anti-punch-through region, and impurity ions in the second doping region diffuse into the semiconductor substrate in the second region under the hard mask layer to form a second anti-punch-through region. Further, the method includes forming a first trench by using the hard mask layer on the semiconductor substrate in the first region as a mask to etch the semiconductor substrate in the first region and the first doping region, wherein the semiconductor substrate between the adjacent first trenches constitutes a first fin. Furthermore, the method includes forming a second trench by using the hard mask layer on the semiconductor substrate in the second region as a mask to etch the semiconductor substrate in the second region and the second doping region, wherein the semiconductor substrate between the adjacent second trenches constitutes a second fin.

Other aspects of the present disclosure can be understood by those skilled in the art in light of the description, the claims, and the drawings of the present disclosure.

DETAILED DESCRIPTION

As explained in the background section, in a FinFET fabricated with existing techniques, a source-drain punch-through phenomenon easily appears between the source region and the drain region and affects the performance of the FinFET.

Figure 1:
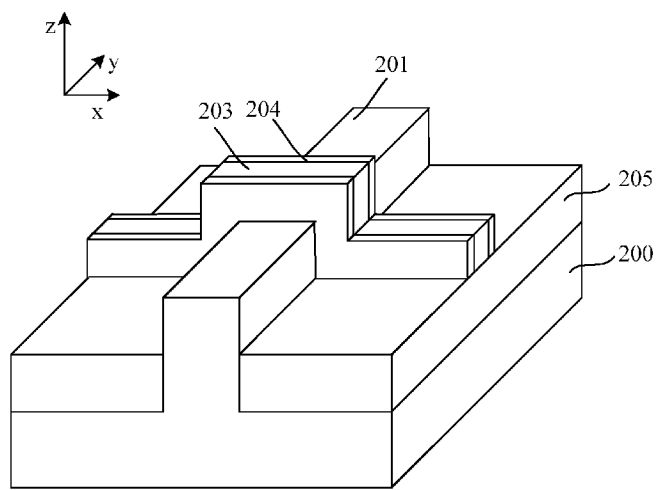
FIG. 1 illustrates a FinFET structure corresponding to an existing fabrication process of a FinFET.

Referring to FIG. 1, in order to form a channel region in a fin 201 covered by a gate structure 203, the distance between the bottom of source and drain regions in the fin 201 and the top of the fin 201 may be large, such that the channel region formed at both side walls of the fin 201 can also be driven by the source and drain regions. However, when the distance between the bottom of the source and drain regions and the top of the fin 201 is large, the control ability of the gate structure 203 at the top of the fin 201 to the bottom of the source and drain regions may be low. Therefore, a punch-through phenomenon appears at the bottom of the source and drain regions and the performance of formed FinFET is degraded.

To prevent the source-drain punch-through phenomenon, one method is to form an anti-punch-through layer at the bottom of the fin 201. Specifically, after forming the fin 201 on the semiconductor substrate 200 and before forming the isolation layer 205, the anti-punch-through layer may be formed at the bottom of the fin 201 by an ion implantation process. The type of doped impurity ions in the anti-punch-through layer is in opposite to the type of doped impurity ions in the source and drain regions to avoid the occurrence of the punch-through phenomenon at the bottom of the source and drain regions. However, the ion implantation process for forming the anti-punch-through layer may cause implantation damages on the surface of the fin 201, leading to poor surface morphology of the fin 201. Therefore, the performance of the FinFET formed in the fin 201 may still be degraded.

Reference will now be made in detail to exemplify embodiments of the invention, which are illustrated in the accompanying drawings. Wherever possible, the same reference numbers will be used throughout the drawings to refer to the same or like parts.

Figure 16:
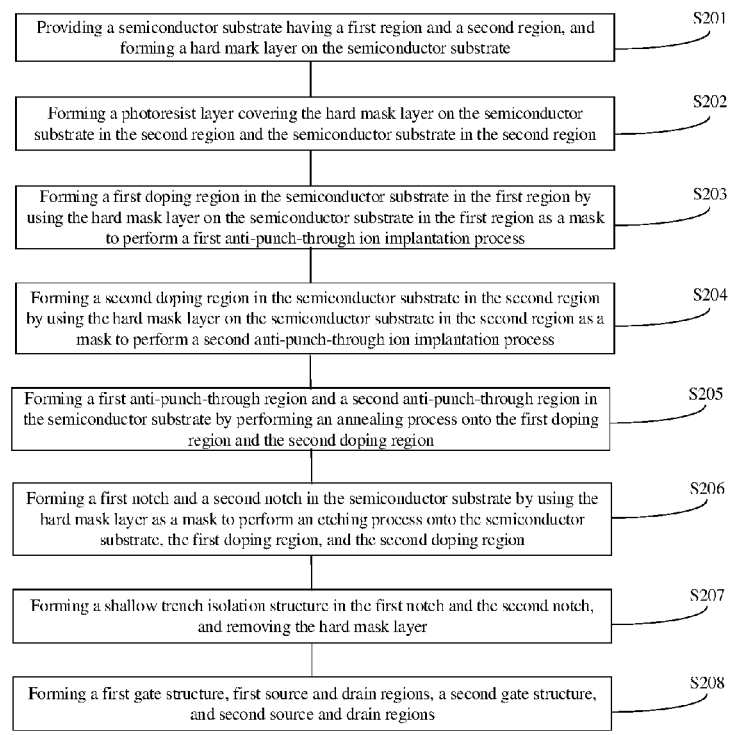
FIG. 16 illustrates an exemplary FinFET fabrication process consistent with the disclosed embodiments.

FIG. 16 illustrates an exemplary FinFET fabrication process consistent with the disclosed embodiments. FIGS. 2-9 illustrate FinFET structures corresponding to certain stages of the exemplary fabrication process.

Figure 2:
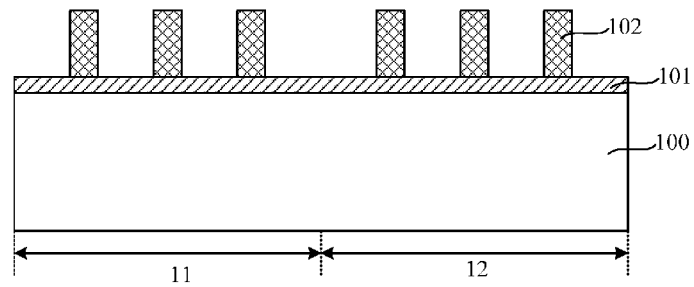
FIGS. 2-9 illustrate FinFET structures corresponding to certain stages of a fabrication process of a FinFET consistent with the disclosed embodiments.

As shown in FIG. 16, at the beginning of the fabrication process, a semiconductor substrate with certain structures is provided (S201). FIG. 2 illustrates a corresponding semiconductor structure.

Referring to FIG. 2, a semiconductor substrate 100 is provided, and the semiconductor substrate 100 may have a first region 11 and a second region 12. Further, a hard mask layer 102 may be formed on the semiconductor substrate 100 in the first region 11 and in the second region 12. The position of the hard mask layer 102 on the semiconductor substrate in the first region 11 may correspond to the position of subsequently formed first fin, and the position of the hard mask layer 102 on the semiconductor substrate in the second region 12 may corresponds to the position of subsequently formed second fin.

The semiconductor substrate 100 may include any appropriate semiconductor material, such as one or more of silicon (Si), germanium (Ge), germanium-silicon alloy (GeSi), silicon carbide (SiC), silicon on insulator (SOI), germanium on insulator (GOI), gallium arsenide (GaAs), and other III-V compounds.

The semiconductor substrate 100 may have a first region 11 and a second region 12, where the first region 11 and the second region 12 may be adjacent or nonadjacent to each other. In one embodiment, the adjacent first region 11 and second region 12 are used as an example to illustrate. Different types of FinFETs may be separately formed on the semiconductor substrate in the first region 11 and on the semiconductor substrate in the second region 12. In one embodiment, an N-type FinFET is formed on the semiconductor substrate in the first region 11 and a P-type FinFET is formed on the semiconductor substrate in the second region 12. In certain other embodiments, a P-type FinFET is formed on the semiconductor substrate in the first region 11 and an N-type FinFET is formed on the semiconductor substrate in the second region 12.

As shown in FIG. 2, a hard mask layer 102 may be formed on the semiconductor substrate 100 in the first region 11 and the second region 12. The hard mask layer 102 on the semiconductor substrate in the first region 11 is used as a mask to subsequently etch the semiconductor substrate to form a first fin. The position and width of the hard mask layer 102 on the semiconductor substrate in the first region 11 are corresponding to the position and width of the subsequently formed first fin.

Further, the hard mask layer 102 on the semiconductor substrate in the first region 11 may also be used as a mask layer and a protective layer for a first anti-punch-through ion implantation process. As the mask layer, the hard mask layer 102 on the semiconductor substrate in the first region 11 defines the position of a first doping region in the semiconductor substrate in the first region 11. As the protective layer, the hard mask layer 102 on the semiconductor substrate in the first region 11 can prevent the implantation damages of the first anti-punch-through ion implantation process onto the semiconductor substrate under the hard mask layer 102. Thus, the surface of the subsequently formed first fin by etching the semiconductor substrate in the first region 11 can avoid implantation damages.

Similarly, the hard mask layer 102 on the semiconductor substrate in the second region 12 is used as a mask to subsequently etch the semiconductor substrate to form a second fin. The position and width of the hard mask layer 102 on the semiconductor substrate in the second region 12 are corresponding to the position and width of the subsequently formed second fin.

Further, the hard mask layer 102 on the semiconductor substrate in the second region 12 may also be used as a mask layer and a protective layer for a second anti-punch-through ion implantation process. As the mask layer, the hard mask layer 102 on the semiconductor substrate in the second region 12 defines the position of a second doping region in the semiconductor substrate in the second region 12. As the protective layer, the hard mask layer 102 on the semiconductor substrate in the second region 12 can prevent the implantation damages of the second anti-punch-through ion implantation process onto the semiconductor substrate under the hard mask layer 102. Thus, the surface of the subsequently formed second fin by etching the semiconductor substrate in the second region 12 can avoid the implantation damages.

The number of layers of the hard mask layer on the semiconductor substrate in the first region 11 is at least one;

and the number of layers of the hard mask layer on the semiconductor substrate in the second region 12 is at least one.

The hard mask layer 102 may be made of $SiO_2$, SiN, SiON, SiCN, SiC, BN, TiN, and/or TaN. The hard mask layer 102 may have a single layer or multilayer (≥2 layers) stacked structure. In one embodiment, the hard mask layer 102 may be a two-layer stacked structure, including a first mask layer and a second mask layer formed on the first mask layer. The first mask layer and the second mask layer may be made of different materials. The first mask layers may be made of $SiO_2$, SiN, SiON, SiCN, SiC, and/or BN; and the second mask layers may be made of $SiO_2$, SiN, SiON, SiCN, SiC, BN, TiN, and/or TaN.

The fabrication process of the hard mask layer 102 includes: forming a hard mask thin film layer on the semiconductor substrate 100; forming a patterned photoresist layer on the hard mask thin film layer; and using the patterned photoresist layer as a mask to etch the hard mask thin film layer to form the hard mask layer 102 on the semiconductor substrate in the first region 11 and the second region 12. In one embodiment, the hard mask layer 102 may be fabricated by a double patterning process.

The width of the hard mask layer may not be too wide. If the width of the hard mask layer is too wide, during a subsequent annealing process, it may be difficult for a process to form a first anti-punch-through region and a second anti-punch-through region by diffusion of impurity ions in the first doping region and the second doping region. The width of the hard mask layer may not be too small. If the width of the hard mask layer is too small, it may be difficult for a process to form a first fin and a second fin by an etching process. In one embodiment, the width of the hard mask layer may be in a range of approximately 10-50 nm, such as 10 nm, 15 nm, 20 nm, 30 nm, 40 nm, 45 nm, and 50 nm.

In one embodiment, before forming the hard mask layer 102, a protective layer 101 may be formed on the semiconductor substrate. The protective layer 101 can be used as a grinding stop layer for subsequently forming a shallow trench isolation structure. After forming the protective layer 101, the hard mask layer may be correspondingly formed on the protective layer 101.

Figure 3:
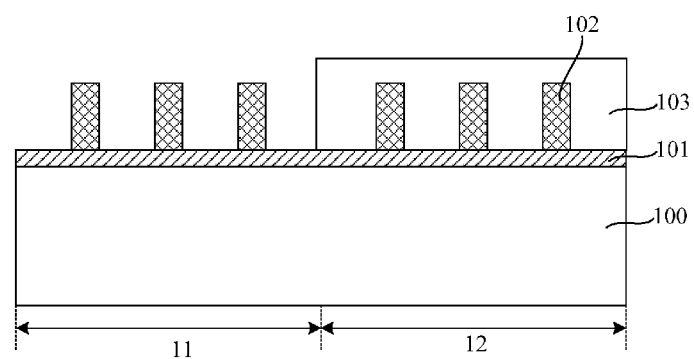

Returning to FIG. 16, after forming the hard mark layer on the semiconductor substrate, a photoresist layer is formed (S202). FIG. 3 illustrates a corresponding semiconductor structure.

As shown in FIG. 3, a photoresist layer 103 may be formed, covering the hard mask layer 102 on the semiconductor substrate in the second region 12 and the semiconductor substrate 100 in the second region 12.

The photoresist layer 103 may protect the semiconductor substrate in the second region 12 from being injected with impurity ions when a subsequent first anti-punch-through ion implantation process is performed.

In one embodiment, the fabrication process of the photoresist layer 103 may be a spin coating process, and the photoresist layer on the semiconductor substrate in the first region 11 may then be removed by exposure and development processes.

Figure 4:
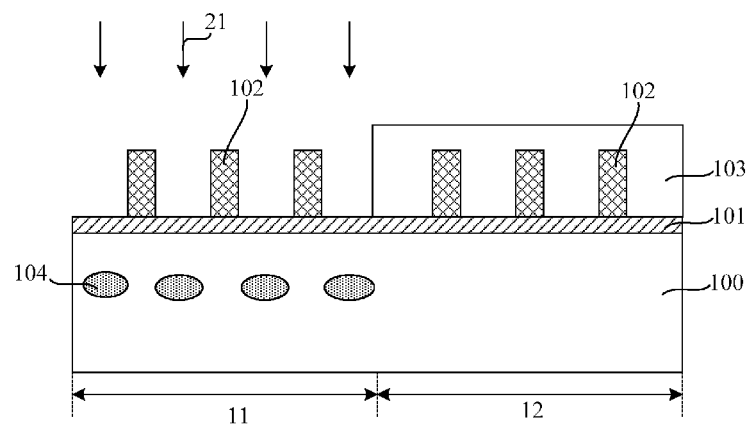

Returning to FIG. 16, after forming the photoresist layer, a first doping region is formed (S203). FIG. 4 illustrates a corresponding semiconductor structure.

As shown in FIG. 4, the hard mask layer 102 on the semiconductor substrate in the first region 11 may be used as a mask to perform a first anti-punch-through ion implantation process 21 to form a first doping region 104 in the semiconductor substrate in the first region 11.

When the first anti-punch-through ion implantation process 21 is performed, the hard mask layer 102, on the semiconductor substrate in the first region 11, may prevent the semiconductor substrate 100 under the hard mask layer 102 (the position for subsequently forming a first fin) from being subject to ion implantation damages. That is, the subsequently formed first fin in the semiconductor substrate in the first region 11 under the hard mask layer 102 may be less susceptible to ion implantation damages.

Further, the hard mask layer 102 on the semiconductor substrate in the first region 11 may precisely define the position of the first doping region 104 formed in the semiconductor substrate 100. Therefore, when a subsequent annealing process is performed, the impurity ions in the first doping region 104 diffuse into the semiconductor substrate 100 in the first region 11 under the hard mask layer 102 to form a first anti-punch-through region. The position of the first anti-punch-through region is relatively accurate, and concentration of impurity ions in the first anti-punch-through region meets the fabrication process requirements.

In one embodiment, an N-type FinFET may be formed in the semiconductor substrate 100 in the first region 11 and the type of impurity ions implanted by the first anti-punch-through ion implantation process 21 may be P-type. The P-type impurity ions may include one or more of boron ions, gallium ions, and indium ions.

In certain other embodiments, a P-type FinFET is formed in the semiconductor substrate 100 in the first region 11 and the type of impurity ions implanted by the first anti-punch-through ion implantation process 21 may be N-type. The N-type impurity ion may include one or more of phosphorus ions, arsenic ions, and antimony ions.

In one embodiment, the implantation angle of the first anti-punch-through ion implantation process 21 may be in a range of approximately 0-10 degrees; the implantation energy of the first anti-punch-through ion implantation process 21 may be in a range of approximately 3-10 KeV; and the dose of the first anti-punch-through ion implantation process 21 may be in a range of approximately $1 \times 10^{14}$-$1 \times 10^{20}$ atoms/$cm^3$.

Figure 5:
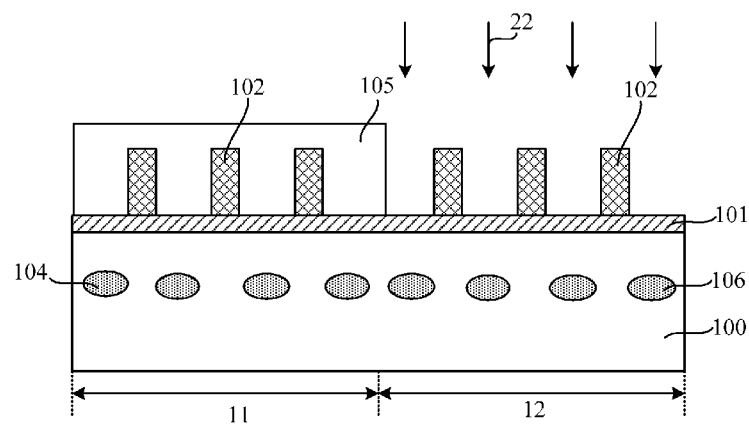

Returning to FIG. 16, after forming the first doping region, a second doping region is formed (S204). FIG. 5 illustrates a corresponding semiconductor structure.

As shown in FIG. 5, the hard mask layer 102 on the semiconductor substrate in the second region 12 may be used as a mask to perform a second anti-punch-through ion implantation process 22 to form a second doping region 106 in the semiconductor substrate 100 in the second region 12. The type of impurity ions implanted by the second anti-punch-through ion implantation process 22 may be different from the type of impurity ions implanted by the first anti-punch-through ion implantation process 21.

Before performing the second anti-punch-through ion implantation process 22, the photoresist layer 103 on the semiconductor substrate in the second region 12 (referring to FIG. 4) may be removed and a photoresist layer 105 may be formed to cover the hard mask layer 102 on the semiconductor substrate 100 in the first region 11 and the semiconductor substrate 100 in the first region 11.

In one embodiment, an N-type FinFET may be formed in the semiconductor substrate 100 in the first region 11 and the type of impurity ions implanted by the first anti-punch-through ion implantation process 21 may be P-type. A P-type FinFET may be formed in the semiconductor substrate 100 in the second region 12 and the type of impurity ions implanted by the second anti-punch-through ion implantation process 22 may be N-type. The N-type impurity ion may include one or more of phosphorus ions, arsenic ions, and antimony ions.

In certain other embodiments, a P-type FinFET may be formed in the semiconductor substrate 100 in the first region 11 and the type of impurity ions implanted by the first anti-punch-through ion implantation process 21 may be N-type. An N-type FinFET may be formed in the semiconductor substrate 100 in the second region 12 and the type of impurity ions implanted by the second anti-punch-through ion implantation process 22 may be P-type. The P-type impurity ion may include one or more of boron ions, gallium ions, and indium ions.

When the second anti-punch-through ion implantation process 22 is performed, the hard mask layer 102 on the semiconductor substrate in the second region 12 may prevent the semiconductor substrate 100 under the hard mask layer 102 (the position for subsequently forming the second fin) from being susceptible to ion implantation damages. That is, the subsequently formed second fin in the semiconductor substrate 100 in the second region 12 under the hard mask layer 102 may be less susceptible to ion implantation damages. Further, the hard mask layer 102 on the semiconductor substrate in the second region 12 may precisely define the position of the second doping region 106 formed in the semiconductor substrate 100. Therefore, when a subsequent annealing process is performed, impurity ions in the second doping region 106 may diffuse into the semiconductor substrate 100 in the second region 12 under the hard mask layer 102 to form a second anti-punch-through region. The position of the second anti-punch-through region may be relatively accurate, and concentration of impurity ions in the second anti-punch-through region may meet the fabrication process requirements.

In one embodiment, the implantation angle of the second anti-punch-through ion implantation process 22 may be in a range of approximately 0-10 degrees; the implantation energy of the second anti-punch-through ion implantation process 22 may be in a range of approximately 3-10 KeV; and the dose of the second anti-punch-through ion implantation process 22 may be in a range of approximately $1\times10^{14}$-$1\times10^{20}$ atoms/cm$^3$.

Figure 6:
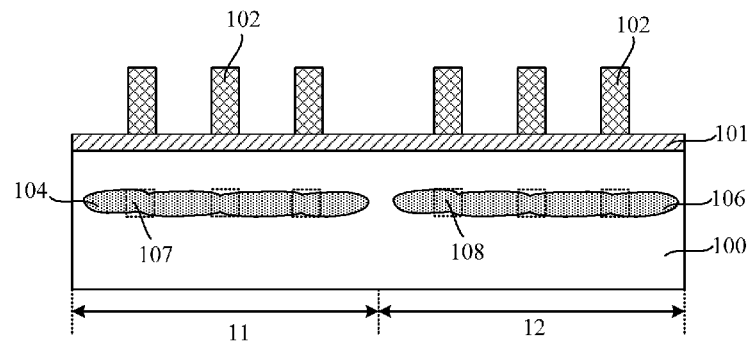

Returning to FIG. 16, after forming the second doping region, a first anti-punch-through region and a second anti-punch-through region are formed (S205). FIG. 6 illustrates a corresponding semiconductor structure.

As shown in FIG. 6, an annealing process may be performed onto the first doping region 104 and the second doping region 106. Therefore, impurity ions in the first doping region 104 may diffuse into the semiconductor substrate 100 in the first region 11 under the hard mask layer 102 to form a first anti-punch-through region 107. Also, impurity ions in the second doping region 106 may diffuse into the semiconductor substrate 100 in the second region 12 under the hard mask layer 102 to form a second anti-punch-through region 108.

The width of the hard mask layer 102 may be in a range of approximately 10-50 nm. Accordingly, the width of subsequently formed first fin and second fin may also be in a range of approximately 10-50 nm, and the diffusion width of impurity ions in the first doping region 104 and the second doping region 106 may be in a range of approximately 10-50 nm. In one embodiment, the annealing temperature may be in a range of approximately 900-1300° C., and the annealing time may be in a range of approximately 30 seconds-10 minutes, such that the impurity ions in the first doping region 104 and the second doping region 106 may sufficiently diffuse into the semiconductor substrate under the hard mask layer 102.

To better illustrate the distinction between the doping region and the anti-punch-through region in FIG. 6, the dashed boxes may be used to indicate the first anti-punch-through region 107 and the second anti-punch-through region 108.

Figure 7:
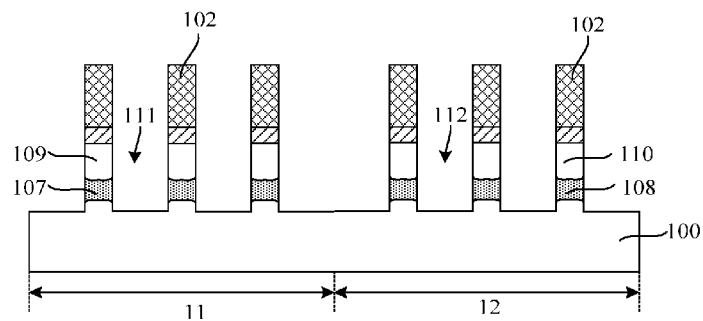

Returning to FIG. 16, after forming the first anti-punch-through region and the second anti-punch-through region, a first trench and a second trench are formed (S206). FIG. 7 illustrates a corresponding semiconductor structure.

As shown in FIG. 7, after performing an annealing process, the hard mask layer 102 on the semiconductor substrate in the first region 11 may be used as a mask to etch the semiconductor substrate 100 in the first region 11 and the first doping region 104 (referring to FIG. 6) to form a first trench 111. The semiconductor substrate between the adjacent first trenches 111 may include a first fin 109. Further, the hard mask layer 102 on the semiconductor substrate in the second region 12 may be used as a mask to etch the semiconductor substrate 100 in the second region 12 and the second doping region 106 (referring to FIG. 6) to form a second trench 112. The semiconductor substrate between the adjacent second trenches 112 constitutes a second fin 110.

The depth of the formed first trench 111 may be greater than the depth of the first doping region 104, such that the formed adjacent first fins 109 may not be electrically connected by the first anti-punch-through region 107. Similarly, the depth of the formed second trench 112 may be greater than the depth of the second doping region 106, such that the formed adjacent second fins 110 may not be electrically connected by the second anti-punch-through region 108.

An anisotropic dry etching process may be performed to etch the semiconductor substrate 100. In one embodiment, the anisotropic dry etching process may be a plasma etching process. Etching gases used in the plasma etching process may include $CF_4$, HBr, He and $O_2$. The flow rate of $CF_4$ gas may be in a range of approximately 20-200 sccm; the flow rate of HBr gas may be in a range of approximately 80-900 sccm; the flow rate of He gas may be in a range of approximately 250-950 sccm; the flow rate of $O_2$ gas may be in a range of approximately 5-20 sccm; the chamber pressure may be in a range of approximately 10-80 mTorr; the chamber temperature may be in a range of approximately 20-100° C.; the RF power may be in a range of approximately 200-2000 W; and the RF bias power may be in a range of approximately 0-150 W.

Figure 8:
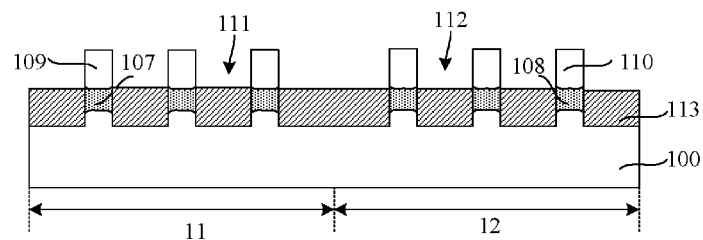

Returning to FIG. 16, after forming the first trench and the second trench, a shallow trench isolation structure is formed and the hard mask layer is removed (S207). FIG. 8 illustrates a corresponding semiconductor structure.

As shown in FIG. 8, a shallow trench isolation structure 113 may be formed in the first trench 111 and the second trench 112. The surface of the shallow trench isolation structure 113 may be below the top surfaces of the first fin 109 and the second fin 110. Further, the hard mask layer 102 may be removed (referring to FIG. 7).

The shallow trench isolation structure 113 may be configured to isolate the adjacent first fins 109 and to isolate the adjacent second fins 110.

The fabrication process of the shallow trench isolation structure 113 may include: forming an isolation material layer covering the semiconductor substrate 100, the first fin 109 and the second fin 110; planarizing the insulation material layer until the top surfaces of the first fin 109 and the second fin 110 are exposed, where a planarization process may include a chemical mechanical polishing process; and removing part of thickness of the planarized insulation material layer by a back etching process to form the shallow trench isolation structure 113 in the first trench 111 and the second trench 112. The surface of the shallow trench isolation structure 113 may be below the top surfaces of the first fin 109 and the second fin 110.

When planarizing the insulation material layer, the protective layer and the hard mask layer on top surfaces of the first fin 109 and the second fin 110 may be removed by the planarization process. The shallow trench isolation structure 113 may be made of any appropriate material, such as $SiO_2$, SiON, SiOCN, and/or SiOBN.

In one embodiment, the surface of the shallow trench isolation structure 113 may level with the surfaces of the first anti-punch-through region and the second anti-punch-through region. The surface of the shallow trench isolation structure 113 may also be slightly above or slightly below the surfaces of the first anti-punch-through region and the second anti-punch-through region.

Figure 9:
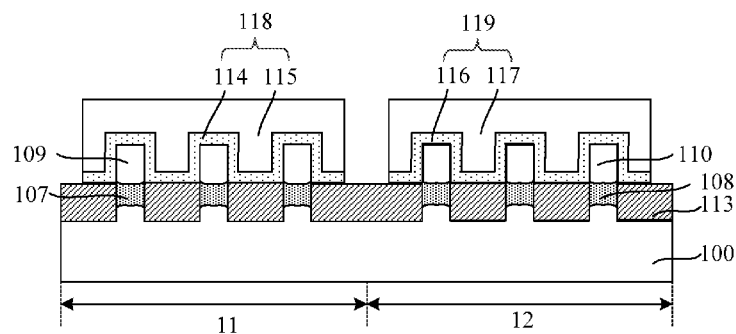

Returning to FIG. 16, after forming the shallow trench isolation structure, a first gate structure, first source and drain regions, a second gate structure, and second source and drain regions are formed (S208). FIG. 9 illustrates a corresponding semiconductor structure.

As shown in FIG. 9, a first gate structure 118 crossing and covering the top and side surfaces of the first fin 109 may be formed, and first source and drain regions may be formed in the fins at both sides of the first gate structure 118 (not labeled). Further, a second gate structure 119 crossing and covering the top and side surfaces of the second fin 110 may be formed; and second source and drain regions may be formed in the fins at both sides of the second gate structure 119 (not labeled). FIG. 9 and foregoing figures may show cross-sectional views along an x-axis direction in FIG. 1.

The first gate structure 118 may include a first gate dielectric layer 114 on the top and side surfaces of the first fin 109, and a first gate electrode 115 on the first gate dielectric layer 114.

The second gate structure 119 may include a second gate dielectric layer 116 on the top and side surfaces of the second fin 110, and a second gate electrode 117 on the second gate dielectric layer 116.

In one embodiment, the first gate dielectric layer 114 and/or the second gate dielectric layer 116 may be made of silicon oxide. The first gate electrode 115 and/or the second gate electrode 117 may be made of polysilicon.

In certain other embodiments, the first gate dielectric layer 114 and/or the second gate dielectric layer 116 may be made of any appropriate high-K dielectric material, such as one or more of $HfO_2$, $Al_2O_3$, $ZrO_2$, HfSiO, HfSiON, HfTaO, and HfZrO. The first gate electrode 115 and/or the second gate electrode 117 may be made of metal, such as one or more of W, Al, Cu, and Ti.

The first gate structure 118 may cross and cover the top and side surfaces of one or more (≥2) of the first fins 109. The second gate structure 119 may cross and cover the top and side surfaces of one or more (≥2) of the second fins 110.

After forming the first gate structure 118, first side wall spacers may be formed at both side surfaces of the first gate structure 118. Using the first gate structure 118 and the first side wall spacers as a mask, an ion implantation process may be performed onto the first fins at both sides of the first gate structure 118 and the first side wall spacers to form first source and drain regions in the first fins at both sides of the first gate structure 118 and the first side wall spacers.

In one embodiment, the first gate structure 118 and the first side wall spacers may be used as a mask to etch the first fins at both sides of the first gate structure 118 and the first side wall spacers to form a trench. The trench may be filled with a stress layer to form first source and drain regions that are strained. The stress layer may cause stress to the channel region and improve the carrier mobility in the channel region. The stress layer may be made of any appropriate material, such as germanium silicon, and/or silicon carbide.

The depth of the first source and drain regions may be the same as the depth of the first anti-punch-through region 107. The depth of the first source and drain regions may also be slightly smaller than the depth of the first anti-punch-through region 107, such that the first anti-punch-through region 107 may have a desired anti-punch-through effect to the first source and drain regions.

After forming the second gate structure 119, second side wall spacers may be formed at both side surfaces of the second gate structure 119. Using the second gate structure 119 and the second side wall spacers as a mask, an ion implantation process may be performed onto the second fins at both sides of the second gate structure 119 and the second side wall spacers to form second source and drain regions in the second fins at both sides of the second gate structure 119 and the second side wall spacers.

In one embodiment, the second gate structure 119 and the second side wall spacers may be used as a mask to etch the second fins at both sides of the second gate structure 119 and the second side wall spacers to form a trench. The trench may be filled with a stress layer to form second source and drain regions that are strained. The stress layer may cause stress to the channel region and improve the carrier mobility in the channel region. The stress layer may be made of any appropriate material, such as germanium silicon and/or silicon carbide.

The depth of the second source and drain regions may be the same as the depth of the second anti-punch-through region 108. The depth of the second source and drain regions may also be slightly smaller than the depth of the second anti-punch-through region 108, such that the second anti-punch-through region 108 may have a desired anti-punch-through effect to the second source and drain regions.

Figure 17:
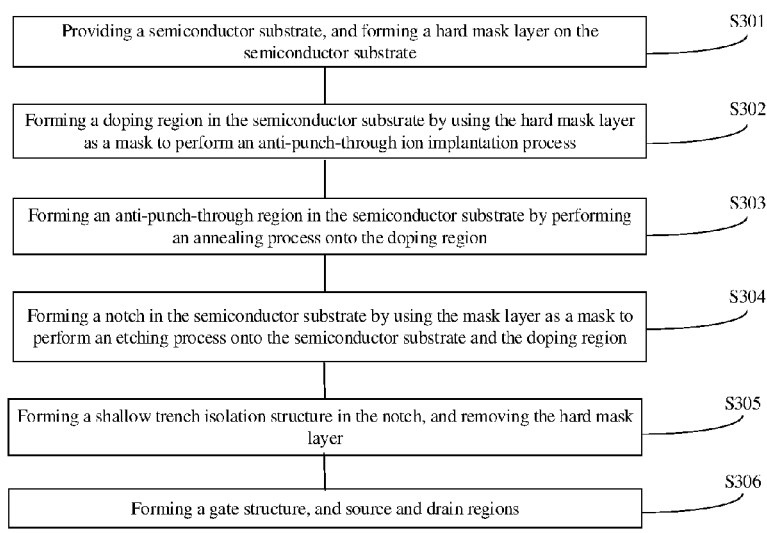
FIG. 17 illustrates another exemplary FinFET fabrication process consistent with the disclosed embodiments.

FIG. 17 illustrates another exemplary FinFET fabrication process consistent with the disclosed embodiments. FIGS. 10-15 illustrate another FinFET structure corresponding to certain stages of the exemplary fabrication process.

The difference between the fabrication process illustrated in FIG. 17 and the fabrication process illustrated in FIG. 16 may be that the FinFET formed through the fabrication process shown in FIG. 17 may include one type (one of N-type and P-type) of FinFET, and the FinFET formed through the fabrication process shown in FIG. 16 may include two types (N-type and P-type) of FinFET formed simultaneously.

Figure 10:
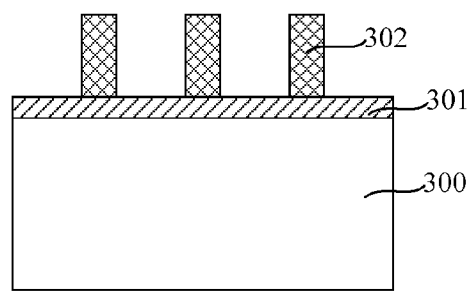
FIGS. 10-15 illustrate FinFET structures corresponding to certain stages of another fabrication process of a FinFET consistent with the disclosed embodiments.

As shown in FIG. 17, at the beginning of the fabrication process, a semiconductor substrate with certain structures is provided (S301). FIG. 10 illustrates a corresponding semiconductor structure.

Referring to FIG. 10, a semiconductor substrate 300 may be provided; and a hard mask layer 302 may be formed on the semiconductor substrate 300. The position of the hard mask layer 302 may correspond to the position of subsequently formed fin. Details of the hard mask layer 302 can be referred to the above descriptions associated with FIG. 16 and are not repeated here.

Figure 11:
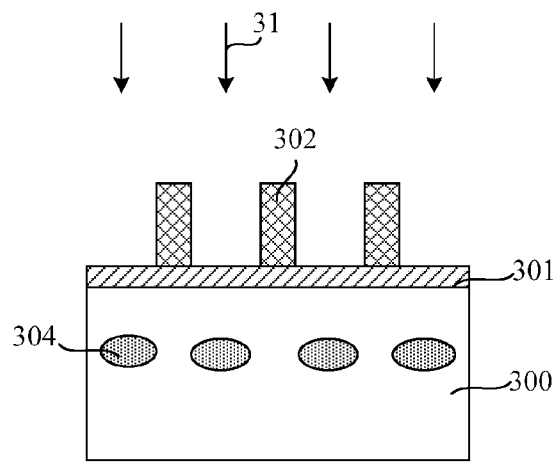

Returning to FIG. 17, after forming the hard mark layer on the semiconductor substrate, a doping region is formed (S302). FIG. 11 illustrates a corresponding semiconductor structure.

As shown in FIG. 11, using the hard mask layer 302 as a mask, an anti-punch-through ion implantation process 31 may be performed to form a doping region 304 in the semiconductor substrate 300.

When the anti-punch-through ion implantation process 31 is performed, the hard mask layer 302 may prevent the semiconductor substrate 300 under the hard mask layer 302 (position for subsequently forming the fin) from being susceptible to ion implantation damages. That is, the subsequently formed fin in the semiconductor substrate 300 under the hard mask layer 302 may be susceptible to less ion implantation damages. Further, the hard mask layer 302 may precisely define the position of the doping region 304 formed in the semiconductor substrate 300. Thus, when a subsequent annealing process is performed, impurity ions in the doping region 304 may diffuse into the semiconductor substrate 300 under the hard mask layer 302 to form an anti-punch-through region. The position of the anti-punch-through region may be relatively accurate, and concentration of impurity ions in the anti-punch-through region may meet the fabrication process requirements.

The impurity ions implanted by the anti-punch-through ion implantation process 31 may be N-type impurity ions or P-type impurity ions.

In one embodiment, the formed FinFET may be an N-type FinFET and the type of impurity ions implanted by the anti-punch-through ion implantation process may be P-type. The P-type impurity ion may include one or more of boron ions, gallium ions, and indium ions.

In certain other embodiments, the formed FinFET may be a P-type FinFET and the type of impurity ions implanted by the anti-punch-through ion implantation process may be N-type. The N-type impurity ion may include one or more of phosphorus ions, arsenic ions, and antimony ions.

In one embodiment, the implantation angle of the anti-punch-through ion implantation process 31 may be in a range of approximately 0-10 degrees; the implantation energy may be in a range of approximately 3-10 KeV; and the dose may be in a range of approximately $1\times10^{14}$-$1\times10^{20}$ atoms/cm$^3$.

Figure 12:
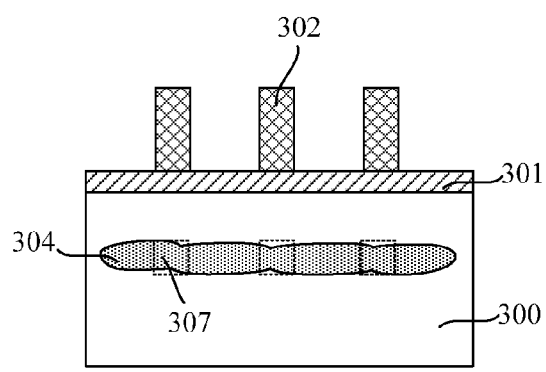

Returning to FIG. 17, after forming the doping region, an annealing process is performed to form an anti-punch-through region (S303). FIG. 12 illustrates a corresponding semiconductor structure.

As shown in FIG. 12, an annealing process may be performed onto the doping region 304, where impurity ions in the doping region 304 may diffuse into the semiconductor substrate 300 under the hard mask layer 302 to form an anti-punch-through region 307.

In one embodiment, the annealing temperature may be in a range of approximately 900-1300° C.; and the annealing time may be in a range of approximately 30 seconds-10 minutes.

Figure 13:
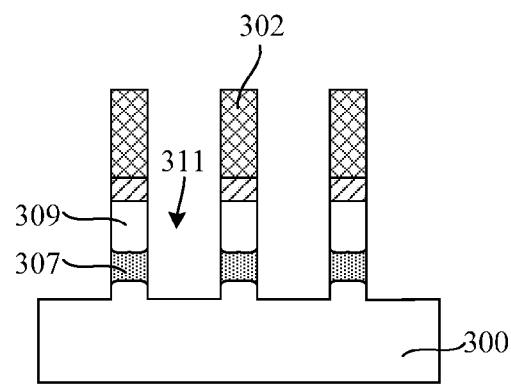

Returning to FIG. 17, after forming the anti-punch-through region, an etching process is performed to form a trench (S304). FIG. 13 illustrates a corresponding semiconductor structure.

As shown in FIG. 13, after performing the annealing process, the hard mask layer 302 may be used as a mask to etch the semiconductor substrate 300 and the doping region 304 (referring to FIG. 12) to form a trench 311. The semiconductor substrate between the adjacent trenches 311 may include a fin 309.

Figure 14:
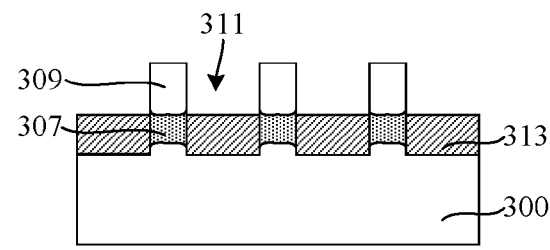

Returning to FIG. 17, after forming the trench, a shallow trench isolation structure is formed (S305). FIG. 14 illustrates a corresponding semiconductor structure.

As shown in FIG. 14, a shallow trench isolation structure 313 may be formed in the trench 311. The surface of the shallow trench isolation structure 311 may be below the top surface of the fin 309.

Figure 15:
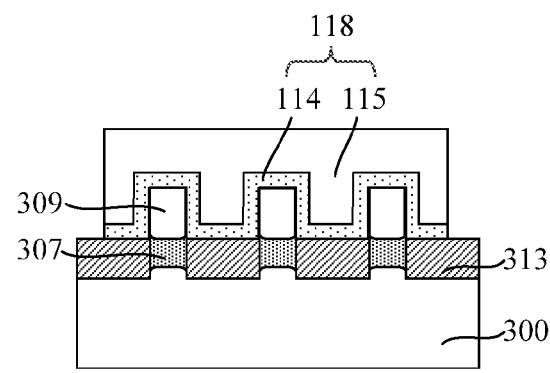

Returning to FIG. 17, after forming the shallow trench isolation structure, a gate structure, and source and drain regions are formed (S306). FIG. 15 illustrates a corresponding semiconductor structure.

As shown in FIG. 15, the hard mask layer may be removed. A gate structure crossing and covering the top and side surfaces of the fin may be formed. The gate structure may include a gate dielectric layer 314 on the top and side surfaces of the fin 309 and a gate electrode 315 on the gate dielectric layer 314. Further, source and drain regions may be formed in the fins 309 at both sides of the gate structure.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a fin field-effect transistor (FinFET), comprising:
   providing a semiconductor substrate;
   forming a hard mask layer on the semiconductor substrate, wherein a position of the hard mask layer corresponds to a position of subsequently formed fin;
   forming a doping region in the semiconductor substrate by using the hard mask layer as a mask to perform an anti-punch-through ion implantation process;
   forming an anti-punch-through region by performing an annealing process onto the doping region, such that impurity ions in the doping region diffuse into the semiconductor substrate under the hard mask layer; and
   forming a trench by using the hard mask layer as a mask to etch the semiconductor substrate and the doping region, wherein the semiconductor substrates between the adjacent trenches constitutes a fin.

2. The method according to claim 1, wherein:
   an implantation angle of the anti-punch-through ion implantation process is in a range of approximately 0-10 degrees;
   an implantation energy of the anti-punch-through ion implantation process is in a range of approximately 3-10 KeV; and
   a dose of the anti-punch-through ion implantation process is in a range of approximately $1\times10^{14}$-$1\times10^{20}$ atoms/cm$^3$.

3. The method according to claim 1, wherein:
   an annealing temperature is in a range of approximately 900-1300° C.; and
   an annealing time is in a range of approximately 30 seconds-10 minutes.

4. The method according to claim 1, wherein:
   a width of the hard mask layer is in a range of approximately 10-50 nm.

5. The method according to claim 1, wherein:
impurity ions implanted by the anti-punch-through ion implantation process are N-type impurity ions, or P-type impurity ions.

6. The method according to claim 5, wherein:
the formed FinFET is an N-type FinFET; and
the impurity ions implanted by the anti-punch-through ion implantation process are P-type impurity ions.

7. The method according to claim 5, wherein:
the formed FinFET is a P-type FinFET; and
the impurity ions implanted by the anti-punch-through ion implantation process are N-type impurity ions.

8. The method according to claim 1, further including:
forming a shallow trench isolation structure, wherein a surface of the shallow trench isolation structure is below a top surface of the fin;
removing the hard mask layer;
forming a gate structure crossing and covering top and side surfaces of the fin; and
forming source and drain regions in the fins at both sides of the gate structure.

9. A method for fabricating a FinFET, comprising:
providing a semiconductor substrate, wherein the semiconductor substrate has a first region and a second region;
forming a hard mask layer on the semiconductor substrate in the first region and the second region, wherein a position of the hard mask layer on the semiconductor substrate in the first region corresponds to a position of subsequently formed first fin, and a position of the hard mask layer on the semiconductor substrate in the second region may corresponds to a position of subsequently formed second fin;
forming a first doping region in the semiconductor substrate in the first region by using the hard mask layer on the semiconductor substrate in the first region as a mask to perform a first anti-punch-through ion implantation process;
forming a second doping region in the semiconductor substrate in the second region by using the hard mask layer on the semiconductor substrate in the second region as a mask to perform a second anti-punch-through ion implantation process, wherein a type of impurity ions implanted by the second anti-punch-through ion implantation process is different from a type of impurity ions implanted by the first anti-punch-through ion implantation process;
performing an annealing process onto the first doping region and the second doping region, wherein impurity ions in the first doping region diffuse into the semiconductor substrate in the first region under the hard mask layer to form a first anti-punch-through region, and impurity ions in the second doping region diffuse into the semiconductor substrate in the second region under the hard mask layer to form a second anti-punch-through region;
forming a first trench by using the hard mask layer on the semiconductor substrate in the first region as a mask to etch the semiconductor substrate in the first region and the first doping region, wherein the semiconductor substrate between the adjacent first trenches constitutes a first fin; and
forming a second trench by using the hard mask layer on the semiconductor substrate in the second region as a mask to etch the semiconductor substrate in the second region and the second doping region, wherein the semiconductor substrate between the adjacent second trenches constitutes a second fin.

10. The method according to claim 9, wherein:
a P-type FinFET is formed in the semiconductor substrate in the first region, and a type of impurity ions implanted by the first anti-punch-through ion implantation process is N-type; and
an N-type FinFET is formed in the semiconductor substrate in the second region, and a type of impurity ions implanted by the second anti-punch-through ion implantation process is P-type.

11. The method according to claim 9, wherein:
an N-type FinFET is formed in the semiconductor substrate in the first region and the type of impurity ions implanted by the first anti-punch-through ion implantation process is P-type; and
a P-type FinFET is formed in the semiconductor substrate in the second region and the type of impurity ions implanted by the second anti-punch-through ion implantation process is N-type.

12. The method according to claim 9, wherein:
an implantation angle of the first anti-punch-through ion implantation process is in a range of approximately 0-10 degrees;
an implantation energy of the first anti-punch-through ion implantation process is in a range of approximately 3-10 KeV; and
a dose of the first anti-punch-through ion implantation process is in a range of approximately $1 \times 10^{14}$-$1 \times 10^{20}$ atoms/cm$^3$.

13. The method according to claim 9, wherein:
an implantation angle of the second anti-punch-through ion implantation process is in a range of approximately 0-10 degrees;
an implantation energy of the second anti-punch-through ion implantation process is in a range of approximately 3-10 KeV; and
a dose of the second anti-punch-through ion implantation process is in a range of approximately $1 \times 10^{14}$-$1 \times 10^{20}$ atoms/cm$^3$.

14. The method according to claim 9, wherein:
an annealing temperature is in a range of approximately 900-1300° C.; and
an annealing time is in a range of approximately 30 seconds-10 minutes.

15. The method according to claim 9, wherein:
a width of the hard mask layer is in a range of approximately 10-50 nm.

16. The method according to claim 9, further including:
forming a shallow trench isolation structure in the first trench and the second trench, wherein a surface of the shallow trench isolation structure is below top surfaces of the first fin and the second fin;
removing the hard mask layer;
forming a first gate structure crossing and covering top and side surfaces of the first fin;
forming first source and drain regions in the fins at both sides of the first gate structure;
forming a second gate structure crossing and covering top and side surfaces of the second fin; and
forming second source and drain regions in the fins at both sides of the second gate structure.

* * * * *